US006573510B1

(12) United States Patent

Vella

(10) Patent No.: US 6,573,510 B1

(45) Date of Patent: Jun. 3, 2003

(54) CHARGE EXCHANGE MOLECULAR ION SOURCE

(75) Inventor: Michael C. Vella, San Leandro, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/596,828

(22) Filed: Jun. 19, 2000

Related U.S. Application Data

(60) Provisional application No. 60/140,149, filed on Jun. 18, 1999.

(51) Int. Cl.[7] ............................ H01S 1/00; H01S 3/00; H05B 31/26; H01J 7/24

(52) U.S. Cl. ................ 250/423 R; 250/251; 250/493.1; 315/111.81

(58) Field of Search ............................ 250/251, 423 R, 250/493.1; 315/111.81

(56) References Cited

U.S. PATENT DOCUMENTS 5,309,064 A * 5/1994 Armini .................. 250/423 R
5,352,899 A * 10/1994 Golovanivsky et al. ........................................ 250/492.21
5,670,785 A * 9/1997 Kitamura ................ 250/423 R
5,977,552 A * 11/1999 Foad ...................... 250/423 R
6,107,634 A * 8/2000 Horsky ................... 250/423 R

FOREIGN PATENT DOCUMENTS

DE 003700625 A1 * 7/1987

* cited by examiner

*Primary Examiner*—Jack Berman
*Assistant Examiner*—Kalimah Fernandez
(74) *Attorney, Agent, or Firm*—Henry P. Sartorio

(57) ABSTRACT

Ions, particularly molecular ions with multiple dopant nucleons per ion, are produced by charge exchange. An ion source contains a minimum of two regions separated by a physical barrier and utilizes charge exchange to enhance production of a desired ion species. The essential elements are a plasma chamber for production of ions of a first species, a physical separator, and a charge transfer chamber where ions of the first species from the plasma chamber undergo charge exchange or transfer with the reactant atom or molecules to produce ions of a second species. Molecular ions may be produced which are useful for ion implantation.

20 Claims, 3 Drawing Sheets

CHARGE EXCHANGE MOLECULAR ION SOURCE

RELATED APPLICATIONS

This application claims priority of Provisional Application Ser. No. 60/140,149 filed Jun. 18, 1999, which is herein incorporated by reference.

GOVERNMENT RIGHTS

The United States Government has rights in this invention pursuant to Contract No. DE-AC03-76SF00098 between the United States Department of Energy and the University of California.

BACKGROUND OF THE INVENTION

The invention relates to ion sources and to charge transfer, and more particularly to charge transfer ion sources.

The phenomenom of charge transfer, or electron charge exchange, has long been known. The simplest kind of charge transfer involves a collision between a neutral particle and a singly charged ion:

$$A^{+}+B \rightarrow A+B^{+}$$

where A, B denote neutral particles in the ground state, and the superscript '+' indicates a single positive charge state. In this case, ion $B^+$ is created by an electron transfer from atom B to ion $A^+$. Prior work on charge transfer in low pressure (<100 mTorr) beam and plasma (gas discharge) systems deals mostly with collisions between single nuclei ion and single nuclei atoms. Some work has been done with simple molecules such as $H_2$, $O_2$, and CO. Charge transfer has been more generally applied to solid state devices and chemical systems, where charge transfer chemistry for very heavy molecules has been studied.

Even between simple atoms and molecules, charge transfer in ion beams and plasma, can be a complex process because ome reactants can be in excited states. Thus excited state charge transfer may occur, e.g.

$$A^{*+}+B^{*} \rightarrow A^{*}+B^{*+}$$

where the superscript '*' indicates an excited state. For the present invention, it is assumed that the excited state is stable on a time scale that affects processes contributing to the species distribution in a plasma source.

If the reactants are like nuclei, resonant charge transfer can occur:

$$A^{n+}+A \rightarrow A+A^{n+}.$$

Resonant cross sections typically peak at or near zero relative energy, and can be significantly larger than nonresonant cross sections. Excited states seem to have relatively little effect on resonant charge transfer involving like atoms and nuclei.

Charge transfer between unlike reactants is usually nonresonant. However, resonant-like charge transfer can sometimes occur at low energy in unlike systems.

Charge transfer is usually a loss mechanism in ion beam systems. It can be an especially important effect in the low energy part of accelerators, such as the extraction gap, where peak gas pressure and maximum transfer cross section overlap. If the gas has molecular states, then charge transfer can produce molecular ions. As the molecular ions are accelerated, they can break up due to collisions with gas, producing breakup products with energy significantly different from the primary beam. Even in a source with pure atomic gas, charge transfer can produce some energy spread, because transfer product ions formed in the acceleration gap experience less than the full acceleration potential, and thus differ in energy from ions accelerated through the full gap.

Resonant and resonant-like charge transfers are intrinsic in plasma sources, because like ions and atoms are present in relatively high density and low relative energy (though often in excited states). The net effect on source performance is difficult to characterize since products and reactants are the same species.

Nonresonant transfer can also occur in plasma sources. However, this is usually less important because the relative energy of the reactants is far below the peak, and the peak cross section is much smaller than resonant.

An ion source for the production of $H^-$ ions based on a charge transfer mechanism has been previously proposed. Molecular hydrogen gas ($H_2$) is dissociated into atomic hydrogen (H) using rf in a first chamber. The dissociated stream of H atoms is then introduced at the focus of a large area, biased, $H^-$ surface conversion ion source. The goal is to produce a high density of cold $H^-$ ions by charge transfer from a low density surface conversion $H^-$ source.

A particular application of plasma ion sources in the semiconductor industry is for ion implantation. Present ion implantation involves a single ion source chamber in which plasma (i.e., ion) generation occurs. Charge exchange between ions and neutral atoms is a natural process that occurs whenever ions and gases are mixed. In present ion sources, charge exchange is usually undesirable because it reduces the current density of the desired ion. Attempts to produce ions of heavy dopant molecules in standard ion sources have generally been unsuccessful because the energetic plasma electrons break up the molecules. In sources with a hot cathode, the cathode temperature can break up heavy molecules.

The trend is for semiconductor devices to become smaller and thinner. These smaller feature sizes challenge the ability of present systems to produce high beam current at low energy. Present ion implanters operate best at energies from about 20 keV to about 2 MeV. Future devices will require the same dopant current as present implanters, but at much lower energies, e.g. from about 2 keV down to hundreds of eV, to produce "shallow junction implants." As energy levels are decreased to accommodate thinner devices, beam transport of standard dopant ions, e.g. boron ($B^+$), arsenic ($As^+$), and phosphorus ($P^+$), becomes inefficient due to beam space charge.

The possibility of producing useful currents of heavy gas molecule ions offers significant efficiency gains over present implanters. For example, a decaborane ion ($B_{10}H_{14}^+$) has ten dopant nucleons per charge, which provides two major benefits. The energy per dopant nucleon is less than one tenth of the ion energy, making it well suited for shallow junction doping or implantation. For example, a 10 keV beam of $B_{10}H_{14}^+$ would deliver dopant at less than 1 keV per boron nucleon. Also the dopant current is ten times the ion current. Only 1 mA of $B_{10}H_{14}^+$ is needed to deliver 10 mA of boron.

Thus it would be advantageous to provide an ion source which produces heavy ions with multiple dopant nucleons per ion, at a sufficient current density, to be effective as an ion implanter, particularly for shallow junction devices.

Other applications of such an ion source would be materials processing, where the macroscopic material properties are altered. This would include buried layers (high energy), or, surface growth/modification (low energy) with heavy molecular beams. Heavy molecular beams are sometimes called cluster beams. To date, practical research on cluster beam procesing has been hampered by the lack of a suitable ion source.

SUMMARY OF THE INVENTION

Accordingly it is an object of the invention to provide a charge exchange molecular ion source.

It is also an object of the invention to provide an ion source which produces molecular ions at a sufficient current to be effective as an ion implanter, particularly for shallow junction devices.

It is another object of the invention to provide a charge exchange ion source with low energy or high energy output for various applications, including surface modification and buried layers.

The invention is method and apparatus for producing ions, particularly molecular ions, including molecular ions with multiple dopant nucleons per ion, by charge exchange. The ion source contains a minimum of two regions separated by a physical barrier that utilizes charge exchange to enhance production of a desired molecular ion species. The essential elements are a plasma chamber for production of ions of a first species, a physical separator, and a charge transfer chamber where ions of the first species from the plasma chamber undergo charge exchange or transfer with the reactant atom or molecules to produce ions of a second species.

The invention can be implemented in a modified Bernas source to produce molecular ion generation by charge exchange, e.g. for semiconductor ion implantation. The Bernas source is modified to have two chambers, one a primary plasma chamber and the second a charge exchange chamber.

A particular embodiment of the invention produces decaborane ions. The ion source of the invention can produce heavy ions with multiple dopant nucleons so that the dopant nucleon energy is a fraction of the ion energy and the dopant nucleon current is a multiple of the ion current. Thus the ion source produces high current, low energy dopant beams which are suitable for shallow junction type devices.

For materials modification (cluster beam) processing, multiple process nucleons leverage the electrical beam current and reduce nucleon energy.

DETAILED DESCRIPTION OF THE INVENTION

The general process of the invention is to produce a resonant charge exchange between an ion $A^+$ and a neutral heavy molecule, MOL:

$$A^+ + MOL \rightarrow A + MOL^+.$$

The heavy molecules are ionized by charge exchange with the ions $A^+$. The ions $A^+$ are first created in a separate chamber, the plasma chamber, of the ion source. The charge transfer rate may be enhanced if at least one of the constituent elements of the molecule can be conveniently ionized. A simple aperture between the chambers allows ions $A^+$ to flow into a second chamber, the charge transfer chamber, of the ion source. As a result of charge exchange, molecular ions are produced. Some of the $MOL^+$ products will fall into an extraction aperture of the ion source and be accelerated. The $MOL^+$ beam current forms the output of the ion source.

One preferred method is to use constituent ions of the molecules for the charge exchange reaction, because some light molecules are known to exhibit resonant cross sections. However, ions of non-constituent elements may also be used, in cases where the heavy molecules have significant charge exchange processes with these ions.

In some cases, a combination of primary ions and molecular gas may have a usable cross section at modest energy (100 eV/amu), but the cross section is very low at plasma source ion energy (1 eV/amu). In this case, addition of modest electrical bias between the plasma chamber and the heavy gas chamber would increase the ion energy and significantly increase $MOL^+$ yield. Lack of thermal isolation between the two chambers may put the molecular population in excited states that are not optimal for charge exchange, or, could cause molecular dissociation. Thus thermal insulation or charge exchange wall temperature control can also be added. Candidate constituent ions may be limited to dopants for which the implanter already has EH&S approval, and readily obtainable, safe gases. However, the principles of the invention apply generally to many different ions and molecules.

Figure 1A:
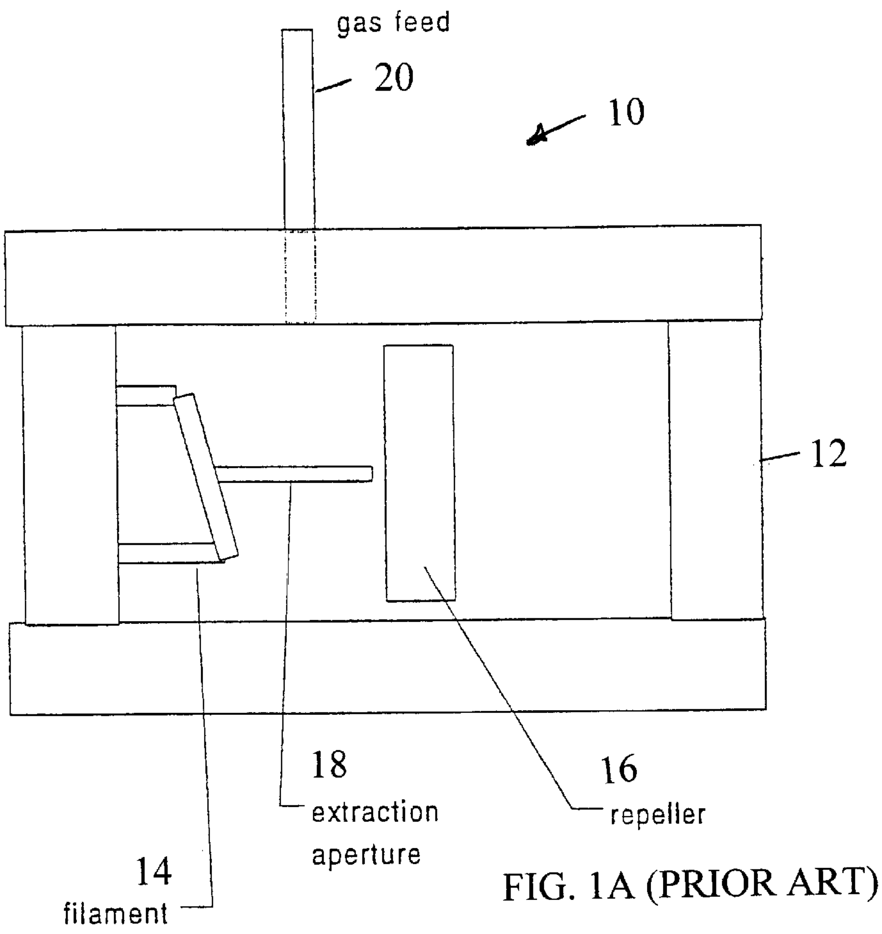
FIG. 1A (PRIOR ART)
FIGS. 1A, B are top and side views of a prior art single chamber medium current Bernas ion source.
Figure 1B:
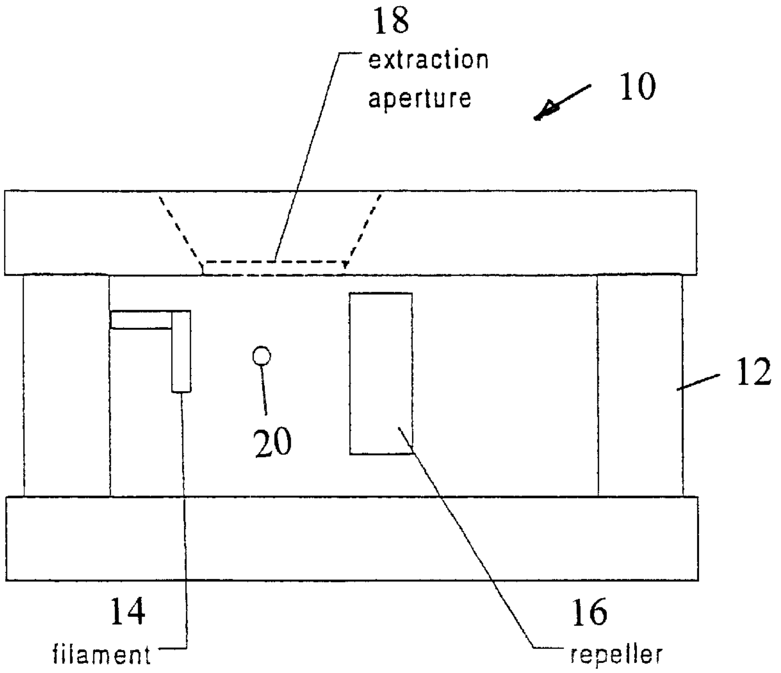
FIG. 1B (PRIOR ART)

The most common ion source in semiconductor ion implantation is the Bernas source, but the principles of the invention are not limited to any particular type of ion source, or, source power. A prior art medium current Bernas source 10 formed of a single chamber 12 is shown in FIGS. 1A, B.

The mechanical components of a standard Bernas source that most strongly affect ion species are the filament 14, repeller 16, and their placement relative to the extraction aperture 18. Gas feed line 20 inputs gas to be ionized into chamber 12. The source magnetic field is externally applied, and oriented parallel to the sidewalls of the chamber 12, along the direction of the elongated extraction aperture 18. In the horizontal direction, the energetic primary electrons that produce ions are electrostatically trapped between the filament/filament shield (not shown) and the repeller. The source magnetic field confines the primary electrons in the orthogonal (radial) direction. This means that ions must migrate across the magnetic field to the extraction aperture, where they are accelerated by the extraction electric field of the accelerator.

Figure 2:
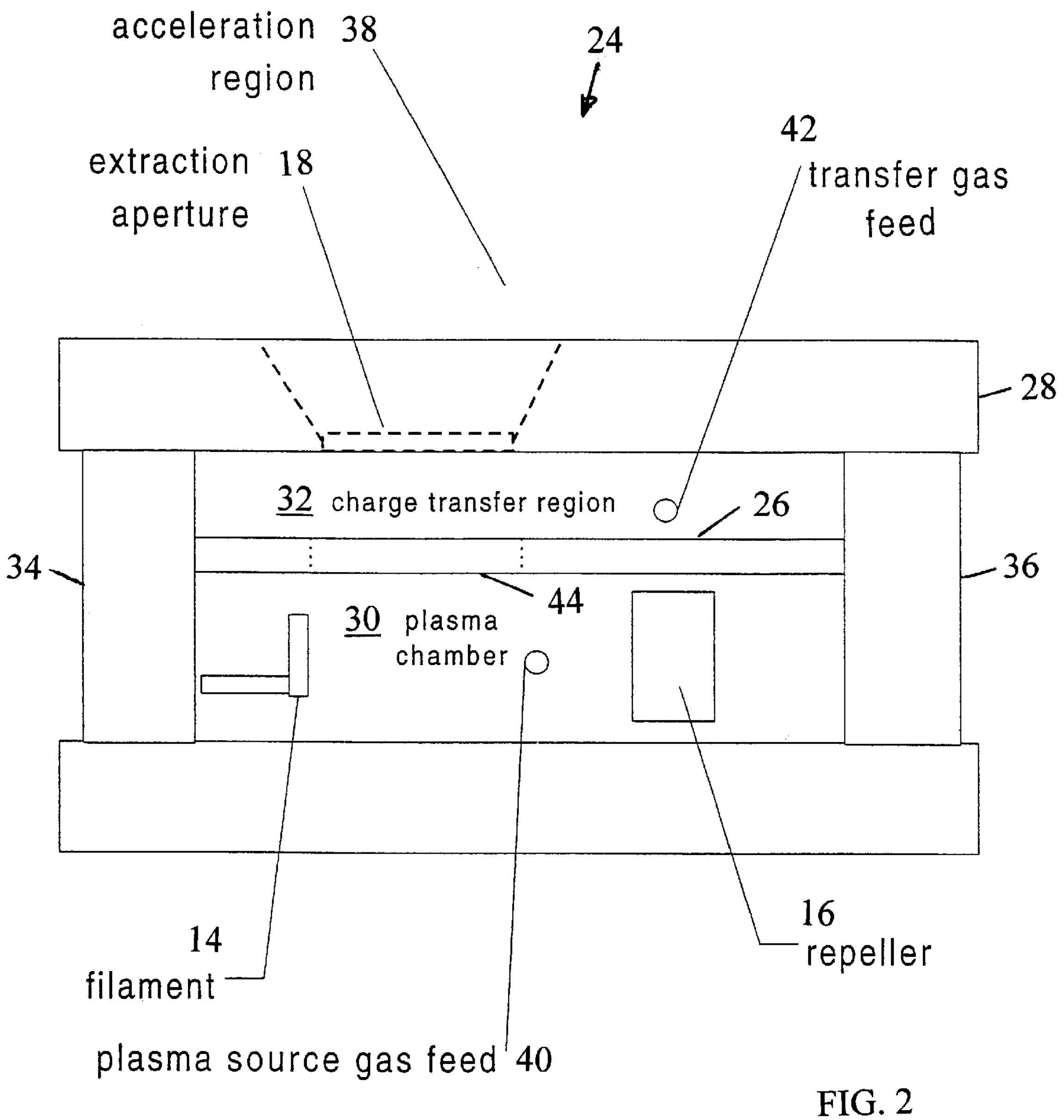
FIG. 2 is a side view of a two chamber Bernas ion source modified according to the invention for charge exchange.

A two-chamber configuration 24 of the Bernas source is formed by inserting an apertured separation plate 26 between the filament 14/repeller 16 and the top plate 28, as illustrated in FIG. 2. Plate 26 divides source 24 into a first chamber 30, which is the primary plasma chamber or ion chamber, and a second chamber 32, which is the charge transfer chamber (region). The plate 26 can be multiple plates to reduce heat transfer between the primary ion chamber and the charge transfer chamber.

In FIG. 2, plasma forming gas is input into plasma chamber 30 through plasma source gas feed 40. Heavy gas molecules (charge transfer molecules) are input into charge transfer chamber 32 through transfer gas feed 42. Gas could be introduced into either or both chambers.

Energetic primary electrons from filament 14 in the plasma chamber 30 will create primary $A^+$ ions. Those ions that drift through aperture 44 in plate 26 into the molecular ion chamber 32 have some probability to charge exchange into $MOL^+$ ions that drift into the extraction aperture 18 and are accelerated into acceleration region 38. The aperture plate 26 serves to maximize the molecular gas density and to the isolate molecular gas from plasma radiation, primary electrons, and heat in the plasma chamber 30.

The purpose of the separation between the two chambers 30, 32 is to minimize interactions other than charge transfer between the plasma chamber 30 and the charge transfer chamber 32. The separation also serves to restrict diffusion of heated gas from the plasma chamber 30 into the transfer chamber 32 where collisions between heated plasma gas and molecular reactants could reduce charge transfer ion production.

Figure 3:
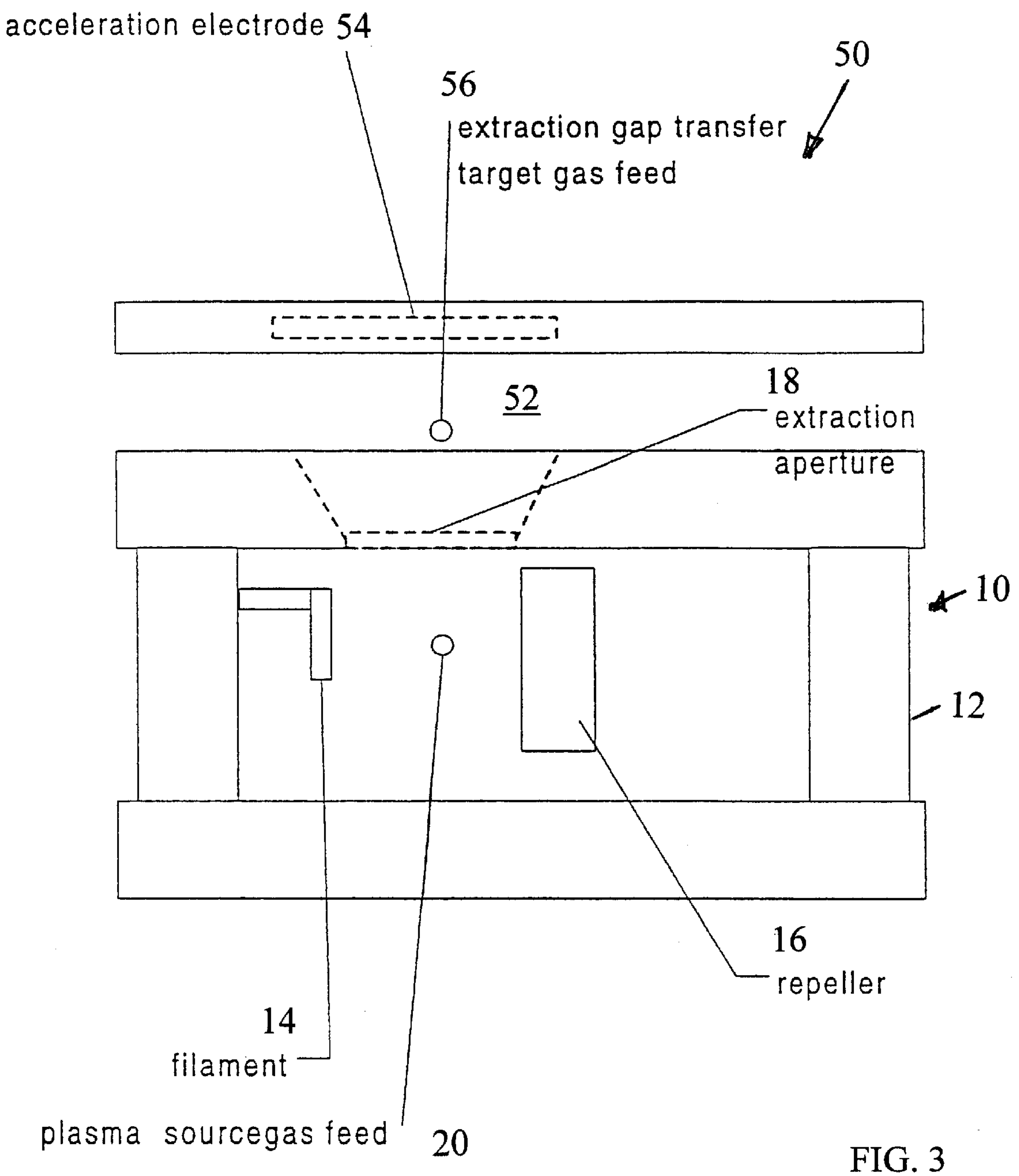
FIG. 3 is a side view of a Bernas ion source modified according to the invention for charge exchange, with the transfer region created in an acceleration gap.

An alternate embodiment of a charge transfer system according to the invention is shown in FIG. 3. System 50 utilizes a single chamber Bernas ion source 10 as shown in FIGS. 1A, B. A charge transfer region 52 is formed in the extraction region or gap of source 10, between extraction aperture 18 and acceleration electrode 54. Gas feed 56 introduces target gas into region 52. While this embodiment is likely to be inefficient in target gas use, it minimizes the number of hardware components.

The examples described above involve positive ions, but similar processes occur for atoms and molecules that have negative ion species. Positive ions are most likely of interest for ion implant applications.

In a particular embodiment of the invention, decaborane ions are produced by charge exchange. Hydrogen or argon ions are produced in the plasma chamber. These ions then charge exchange with decaborane atoms to produce the decaborane ions. The advantage of the decaborane ions is that they contain ten boron atoms. Thus the boron nucleon energy is about one tenth of the decaborane ion energy and the boron nucleon current is about ten times the decaborane ion current. Thus the ion source produces high current, low energy boron dopant beams which are suitable for shallow junction type devices. The principles can be similarly applied to other molecules.

Changes and modifications in the specifically described embodiments can be carried out without departing from the scope of the invention which is intended to be limited only by the scope of the appended claims.

What is claimed is:

1. Apparatus for producing ions by charge exchange comprising a modified Bernas ion source containing a minimum of two regions separated by a physical barrier having an aperture therein, wherein ions produced in a first region pass through the aperture and ionize molecules in a second region by charge exchange.

2. Apparatus for producing ions by charge exchange comprising an ion source, wherein the ion source comprises:

a hot cathode plasma chamber for production of ions of a first species, a charge transfer chamber or region containing atoms or molecules of a second species, and a physical separator between the plasma chamber and charge transfer chamber or region and having an aperture therein, wherein ions of the first species from the plasma chamber pass through the aperture and undergo charge exchange or transfer with the atoms or molecules of the second species to produce ions of the second species.

3. The apparatus of claim 2 wherein the charge transfer chamber or region comprises an extraction gap between an extraction aperture of the plasma chamber and an acceleration electrode.

4. The apparatus of claim 2 wherein the second species is a molecule with multiple dopant nucleons per molecule.

5. The apparatus of claim 2 wherein the first species is hydrogen or argon and the second species is decaborane.

6. The apparatus of claim 2 wherein the ions of the second species have sufficient current and energy for use in an ion implanter.

7. The apparatus of claim 2 wherein the plasma chamber is electrically biased relative to the charge transfer chamber to increase the energy of ions passing from the plasma chamber to the charge transfer chamber to enhance charge exhange or transfer with the atoms or molecules in the charge transfer chamber.

8. The apparatus of claim 2 wherein the walls of the charge transfer chamber are temperature controlled.

9. A method of producing ions by charge exchange, comprising:

producing ions of a first species in a first region by a hot cathode, allowing ions of the first species to enter a physically separated second region containing atoms or molecules of a second species, wherein ions of the first species from the first region undergo charge exchange or transfer with the atoms or molecules of the second species in the second region to produce ions of the second species.

10. The apparatus of claim 1 wherein the first region includes a gas inlet for inletting a gas; a filament for ionizing the gas; and a repeller for containing the ions.

11. The apparatus of claim 1 wherein the ions in the first region are hydrogen or argon and the molecules are decaborane.

12. The apparatus of claim 11 wherein the decaborane ions have sufficient current and energy for use in an ion implanter.

13. The apparatus of claim 1 wherein the ions produced in the first region are ions of a constituent element of the molecules in the second region.

14. The apparatus of claim 1 wherein the first region is electrically biased relative to the second region to increase the energy of ions passing from the first region to the second region to enhance charge exhange or transfer with the molecules in the second region.

15. The apparatus of claim 2 wherein the ion source is a modified Bernas source.

16. The apparatus of claim 2 wherein the second species is a molecule and the first species is a constituent element of the molecule.

17. The method of claim 9 wherein the ions are produced in a modified Bernas source.

18. The method of claim 9 further comprising ion implanting the ions of the second species.

19. In an ion implantation system, the apparatus of claim 1.

20. In an ion implantation system, the apparatus of claim 2.

* * * * *